(12) United States Patent
Timler et al.

(10) Patent No.: US 12,152,156 B2
(45) Date of Patent: *Nov. 26, 2024

(54) SELF-SINTERING CONDUCTIVE INKS (71) Applicant: Science Applications International Corporation, Reston, VA (US)

(72) Inventors: John Timler, River Ridge, LA (US); Xingcun C. Tong, Reston, VA (US)

(73) Assignee: Science Applications International Corporation, Reston, VA (US)

( * ) Notice: Subject to any disclaimer, the term of this patent is extended or adjusted under 35 U.S.C. 154(b) by 248 days.

This patent is subject to a terminal disclaimer.

(21) Appl. No.: 17/211,248

(22) Filed: Mar. 24, 2021

(65) Prior Publication Data

US 2022/0306887 A1 Sep. 29, 2022

(51) Int. Cl.
C09D 11/52 (2014.01)
B82Y 30/00 (2011.01)
(Continued)

(52) U.S. Cl.
CPC ............ C09D 11/52 (2013.01); C09D 11/033 (2013.01); C09D 11/102 (2013.01); C09D 11/38 (2013.01);
(Continued)

(58) Field of Classification Search
CPC ..... C09D 11/52; C09D 11/033; C09D 11/102; C09D 11/38; H05K 1/097; H05K 3/1283;
(Continued)

(56) References Cited

U.S. PATENT DOCUMENTS 3,958,206 A 5/1976 Klint
5,130,689 A 7/1992 Raykhtsaum et al.
(Continued)

FOREIGN PATENT DOCUMENTS

CN 106118216 A 11/2016
CN 207909058 U * 9/2018
(Continued)

OTHER PUBLICATIONS

He, Tiantian, et al. "Reactivity of Al-Rich Alloys with Water Promoted by Liquid Al Grain Boundary Phases." Journal of Materials Science & Technology, vol. 33, No. 4, 2017, pp. 397-403., https://doi.org/10.1016/j.jmst.2016.11.013. (Year: 2017).*
(Continued)

*Primary Examiner* — Jennifer A Smith
*Assistant Examiner* — Jeffrey Eugene Barzach
(74) *Attorney, Agent, or Firm* — Banner & Witcoff, Ltd.

(57) ABSTRACT

Self-sintering conductive inks can be printed and self-sintered with a simple and low-cost process mechanized by exothermic alkali metal and water reaction, with enhanced electrical and thermal performance by liquid metal fusion. Such self-sintering conductive inks may include a gallium-alkali metal component and a water absorbing gel component. After patterning, the self-sintering inks, on reaching a designed trigger temperature (including room temperature), may metallize through a two-step process. Initially the gallium-alkali metal component activates and reacts with water released from the water absorbing gel component. Then the exothermic reaction between the water and the alkali element creates an intense and highly localized heating effect, which liquefies all metallic components in the ink and, on cooling, creates a solid metal trace or interconnect. Post cooling, the metal trace or interconnect cannot be reflowed without a significant temperature increase or other energetic input.

6 Claims, 3 Drawing Sheets (51) Int. Cl.
| | |
|---|---|
| B82Y 40/00 | (2011.01) |
| C09D 11/033 | (2014.01) |
| C09D 11/102 | (2014.01) |
| C09D 11/38 | (2014.01) |
| H05K 1/09 | (2006.01) |

(52) U.S. Cl.
CPC ............. *H05K 1/097* (2013.01); *B82Y 30/00* (2013.01); *B82Y 40/00* (2013.01)

(58) Field of Classification Search
CPC .. H05K 2203/1131; B82Y 30/00; B82Y 40/00
See application file for complete search history.

(56) References Cited

U.S. PATENT DOCUMENTS

| | | | |
|---|---|---|---|
| 5,793,275 | A | 8/1998 | Iversen |
| 5,939,969 | A | 8/1999 | Doerrwaechter et al. |
| 6,064,293 | A | 5/2000 | Jungst et al. |
| 6,194,988 | B1 | 2/2001 | Yamaguchi et al. |
| 6,348,851 | B1 | 2/2002 | Wyser et al. |
| 6,445,276 | B2 | 9/2002 | Schon et al. |
| 6,556,119 | B1 | 4/2003 | Lell |
| 6,582,676 | B2 | 6/2003 | Chaklader |
| 7,498,923 | B2 | 3/2009 | Iversen |
| 7,566,360 | B2 | 7/2009 | Garbar et al. |
| 7,938,879 | B2 | 5/2011 | Woodall et al. |
| 8,012,676 | B2 | 9/2011 | Yoshiki et al. |
| 8,080,233 | B2 | 12/2011 | Woodall et al. |
| 8,994,489 | B2 | 3/2015 | Redaelli et al. |
| 10,184,075 | B2 | 1/2019 | Bissell et al. |
| 10,492,297 | B2 | 11/2019 | Chopra et al. |
| 2002/0113685 | A1 | 8/2002 | Zaki et al. |
| 2011/0050384 | A1 | 3/2011 | Chen et al. |
| 2011/0068889 | A1 | 3/2011 | Senda et al. |
| 2011/0073178 | A1* | 3/2011 | Tan ................. H01L 31/022425 252/514 |
| 2012/0052001 | A1 | 3/2012 | Woodall et al. |
| 2012/0112788 | A1 | 5/2012 | Lung |
| 2012/0168684 | A1 | 7/2012 | Magdassi et al. |
| 2013/0195729 | A1 | 8/2013 | Woodall et al. |
| 2015/0322275 | A1* | 11/2015 | Okamoto ............. C09D 11/037 252/514 |
| 2017/0117235 | A1 | 4/2017 | Borenstein et al. |
| 2017/0253751 | A1* | 9/2017 | Busbee ................ C09D 175/06 |
| 2020/0221580 | A1 | 7/2020 | Tavakoli et al. |
| 2022/0165529 | A1 | 5/2022 | Timler et al. |

FOREIGN PATENT DOCUMENTS

| | | | | |
|---|---|---|---|---|
| CN | 110240830 | A | | 9/2019 |
| CN | 110828029 | A * | 2/2020 | ............... H01B 1/14 |
| CN | 111849250 | A * | 10/2020 | ............. C09D 11/52 |
| CN | 111860736 | A * | 10/2020 | ....... G06K 19/07745 |
| CN | 111863308 | A * | 10/2020 | ............. C09D 11/03 |
| CN | 111876025 | A * | 11/2020 | |
| CN | 115274180 | A * | 11/2022 | |
| JP | 2005063951 | A * | 3/2005 | ............... H01B 1/24 |
| WO | 02/14213 | A2 | 2/2002 | |

OTHER PUBLICATIONS

English Machine Translation of CN111849250A ("Machine_Translation_Yan_CN_111849250_A") (Year: 2020).*
English Machine Translation of CN115274180A ("Machine_Translation_Liu_CN_115274180_A") (Year: 2022).*
Murray, J.L. The Al—Ga (Aluminum-Gallium) system. Bulletin of Alloy Phase Diagrams 4, 183-190 (1983). https://doi.org/10.1007/BF02884877 (Year: 1983).*
"Eutectic Alloy." D&T Online, May 20, 2017, wiki.dtonline.org/index.php/Eutectic_Alloy. (Year: 2017).*
Yu et al. "Preparations, Characteristics and Applications of the Functional Liquid Metal Materials." Advanced Engineering Materials, vol. 20, No. 5, 2017, p. 1700781, https://doi.org/10.1002/adem.201700781. (Year: 2017).*
English Machine Translation of CN111863308A (Year: 2020).*
English Machine Translation of CN111860736A (Year: 2020).*
English Machine Translation of CN111876025A (Year: 2020).*
English machine translation of CN-110828029-A (Year: 2020).*
English machine translation of JP-2005063951-A (Year: 2005).*
English machine translation of CN-207909058-U (Year: 2018).*
Lee, J., Kim, J.,Park, J. & Lee, C. (2018) Characterization of in situ silver nanoparticles sintering on commercial photo papers in inkjet printing. Flex. Print. Electronics 3.
Magdassi, Shlomo, Grouchko, Michael, Berezin, Oleg, and Kamyshny, Alexander, "Triggering the sintering of silver nanoparticles at room temperature" and Supporting Information, ACS Nano 4, 4, pp. 1943-1948, DOI: 10.1021.nn901868t.
Shen, Wenfeng, Zhang, Xianpeng, Huang, Qijin, Xu, Qingsong, and Song, Weijie, "Preparation of solid silver nanoparticles for inkjet printed flexible electronics with high conductivity," Nanoscale 6 (2014), pp. 1622-1628.
Allen, Mark, Leppaniemi, Jaakko, Vilkman, Marja, Alastalo, Ari, and Mattila, Tomi, "Substrate-facilitated hanoparticle sintering and component interconnection procedure," Nanotechnology 21 (2010) 475204, 6 pages, DOI: 10.1088/0957-4484/21/475204.
Peng, Peng, Li, Lihang, Guo, Wei, Hui, Zhuang, Fu, Jian, Jin, Chao, Liu, Yangai, and Zhu, Ying, "Room-temperature joining of silver nanoparticles using potassium chloride solution for flexivel electrode application," J. Phys. Chem. C 2018, 122(5), pp. 2704-2711, DOI: 10.1021/acs.jpcc.7b10601.
Grasso, Salvatore, Biesuz, Mattia, Zoli, Luca, Taveri, Gianmarco, Duff, Andrew I., Ke, Daoyao, Jiang, Anna, and Reece, Michael J., "A review of cold sintering processes," Advances in Applied Ceramics, vol. 119, No. 3, (2020), pp. 115-143, DOI: 10.1080/17436753.2019.1706825.
Boley, J. William, White, Edward L., Chiu, George T.-C. and Kramer, Rebecca K., "Direct Writing of Gallium-Indium Alloy for Stretchable Electronics," Advanced Functional Materials, vol. 24, (2014), pp. 3501-3507.
Wang, Dawei et al., "Cold sintering of microwave dielectric ceramics and devices," Journal of Materials Research, vol. 36, Issue 2, (Jan. 2021), pp. 333-349.
Wang, Binghao, et al., "High-k Gate Dielectrics for Emerging Flexible and Stretchable Electronics", Chem. Rev., vol. 118 (2018), pp. 5690-5754.
Yogeswaran, N., et al. "New materials and advances in making electronic skin for interactive robots," 2015 Advanced Robotics, 29:21, 1359-1373, DOI: 10.1080/01691864.2015.1095653.
Zhou, Hongyang, et al., "Review of flash sintering with strong electric field", High Voltage, 2021, pp. 1-11, DOI: 10.1049/hve2.12080.
Peng, Rui, et al., "The sintering and dielectric properties modification of Li2MgSiO4 ceramic with Ni2+-ion doping based on calculation and experiment," Journal of Materials Research and Technology 2020; 9(2), pp. 1344-1356, DOI: 10.1016/j.jmrt.2019.11.061.
Yuen, Michelle, et al., "Self-sintering liquid metal colloidal inks for facile manufacture of stretchable conductors," 2020 3rd IEEE International Conference on Soft Robotics (RoboSoft), Yale University, pp. 676-681.
Xie, Zhixiong, et al., "Enhanced Hydrogen Generation Properties of Al—Ga—In—Sn Alloy in Reaction with Water by Trace Amount of AlTi5B Additivies," downloaded Oct. 20, 2020 from <https://pdfs.semanticscholar.org/768b/1bdd0d33cc8e9ea0e2af6e3c3031ecdb01db.pdf?_ga=2.229568857.431441619.1599169590-562954880.1580147990>, Materals Transactions, vol. 58, No. 5 (2017), pp. 724-727.
Wang, Hong-Wen, et al., "Generation of hydrogen from aluminum and water—Effect of metal oxide nanocrystals and water quality," downloaded Oct. 20, 2020 from <https://depts.washington.edu/solgel/documents/pub_docs/journal_docs/2011/11-IntJHydro-HW%20Wang.pdf>, International Journal of Hydrogen Energy 36 (2011) 15136-15144.
Hirschey, Jason, et al., "Review of Inorganic Salt Hydrates with Phase Change Temperature in Range of 5° C. to 60° C. and Material (56) References Cited

OTHER PUBLICATIONS

Cost Comparison with Common Waxes," 5th International High Performance Buildings Converence at Purdue, Jul. 9-12, 2018, 3653, pp. 1-10.

Petrovic, John, et al., U.S. Department of Energy, "Reaction of Aluminum with Water to Produce Hydrogen," downloaded Oct. 20, 2020 from <https://www.energy.gov/sites/prod/files/2014/03/f9/aluminum_water_hydrogen.pdf>, 27 pages.

Takai, Osamu, "Fundaments and Applications of Solution Plasma," Journal of Photopolymer Science and Technology, vol. 27, No. 3 (2014) 379-384, 2014.

Zhang, Fan, et al., "Hydrolytic Hydrogen Production on Al—Sn—Zn Alloys Processed by High-Pressure Torsion," downloaded Oct. 20, 2020 from <https://www.ncbi.nlm.nih.gov/pmc/articles/PMC6073298/pdf/materials-11-01209.pdf>, Materials 2018, 11, 1209; pp. 1-18.

"New process generates hydrogen from aluminum alloy to run engines, fuel cells," Purdue University News, May 15, 2007, downloaded Sep. 3, 2020, 5 pages, downloaded from <https://www.purdue.edu/uns/x/2007a/070515WoodallHydrogen.html>.

Iqbal, Kashif, et al., "Phase change materials, their synthesis and application in textiles—a review," The Journal of The Textile Institute, vol. 110, No. 4, 625-638, Jan. 8, 2019.

Saito, Nagahiro, et al., "Solution plasma: A new reaction field for nanomaterials synthesis," Japanese Journal of Applied Physics, 2018, 57, 0102A4, 11 pages.

Uda, Masahiro, et al., "Hydrogen generation from water using Mg nanopowder produced by arc plasma method," Sci. Technol. Adv. Mater. 13 (2012) 025009, 2012, 7 pages.

Ziebarth, Jeffrey T., et al., "Liquid phase-enabled reaction of Al—Ga and Al—Ga—In—Sn alloys with water," International Journal of Hydrogen Energy 36 (2011) 5271-5279, downloaded Oct. 20, 2020 from <https://woodall.ece.ucdavis.edu/wp-content/uploads/sites/84/2016/02/ziebarth2011.pdf>.

Wang, Binghao, et al., "High-k Gate Dielectrics for Emerging Flexible and Stretchable Electronics," Chemical Reviews, Chem. Rev. 2018, 118, 5690-5754, downloaded May 21, 2021, <<https://pubs.acs.org/sharingguidelines for options on how to legitamtely share published articles>>.

Liu, J., Kumar, P., Dutta, I., Raj, R., Sidhu, R., Renavikar, M., and Mahajan, R., "Liquid phase sintered Cu—In composite solders for thermal interface material and interconnect applications", J Mater Sci (2011) vol. 46, pp. 7012-7025.

Lewis, Jacob S., Perrier, Timothy, Barani, Zahra, Kargar, Fariborz, and Balandin, Alexander A., "Thermal Interface materials with graphene fillers: review of the state of the art and outlook for future applications", Nanotechnology vol. 32 (2021), 30 pages.

Tong, Xingcun Colin, Advanced Materials for Thermal Management of Electronic Packaging, Springer Science +Business Media LLLC, 2011.

U.S. Appl. No. 17/402,324, filed Aug. 13, 2021, titled "Sinterable Compounds Comprising Dielectric Material, Articles Formed from Such Compounds, and Methods of Forming Such Compounds and Articles".

Groucho, Michael, Kamyshny, Alexander, Mihailescu, Cristina Florentina, Anghel, Dan Florin and Magdassi, Schlomo, "Conductive Inks with a "Built-In" Mechanism That Enables Sintering at Room Temperature," American Chemical Society Nano, vol. 5, No. 4, (2011), pp. 3354-3359.

Bourassa, Justin, Ramm, Alex, Feng, James Q., Renn, Michael J., "Water vapor-asissted sintering of silver nanoparticle inks for printed electronics", SN Applied Sciences (2019) 1:517, https://doi.org/10.1007/s42452-019-0542-0, 6 pages.

Hu, Donghao, Ogawa, Kazuyoshi, Kajiyama, Mikio, "Characterization of self-assembled silver nanoparticle ink based on nanoemulsion method", R Soc Open Sci. May 27, 2020;7(5):200296, 14 pages.

Mo, Lixin, Guo, Zhenxin, Yang, Li, et al., "Silver Nanoparticles Based Ink with Moderate Sintering in Flexible and Printed Electronics," Int. J. Mol. Sci. 2019, 20, 2124; doi:10.3390/ijms20092124, 28 pages.

Mo, Lixin, Guo, Zhenxin, Wang, Zhenguo, et al., "Nano-Silver Ink of High Conductivity and Low Sintering Temperature for Paper Electronics," Nanoscale Research Letters (2019) 14:197, 11 pages.

Amendola, S., Palombi, A. and Marrocco, G., "Inkjet Printing of Epidermal RFID Anetennas by Self-Sintering Conductive Ink", IEEE Transactions on Microwave Theory and Techniques, vol. 66, No. 3, Mar. 2018, pp. 1561-1569.

Nov. 24, 2022 (WO) International Search Report and Written Opinion—App. No. PCT/US2022/019792.

* cited by examiner

SELF-SINTERING CONDUCTIVE INKS

GOVERNMENT LICENSE RIGHTS

This invention was made with Government support under Contract No. N00178-04-D-4119-FC2846 awarded by the United States Navy. The Government has certain rights in this invention.

BACKGROUND

Conductive inks are generally formulated with metallic (conductive) micro/nanoparticles (e.g. silver, copper, and gold) or carbon particles (e.g. graphene and carbon nanotubes) in an insulate or weak conductive retention matrix. The retention matrix includes organic additives (e.g. dispersants and stabilizers) to prevent agglomeration caused by the high surface energy of the micro/nanoparticles. Such additives encapsulate the particles.

The conductive inks can be deposited onto substrates according to designed circuit patterns by a number of printing techniques such as screen printing, syringe-needle type dispenser, inkjet, and 3-D printers. After printing and solvent evaporation, the metal micro/nanoparticles usually do not become adequately conductive due to the organic additives added to the conductive ink. For example, movement of electrons between metal particles can be prevented by an organic layer as thin as a few nanometers. Therefore particle-ligand bonds must be broken to allow for removal of polymeric ligands between contacting particle surfaces to establish metal-to-metal atomic diffusion among particles.

Thus in order to create a contact path with the conductive particles, it is necessary that the volume of the matrix be reduced either with a curing or an evaporation process, also called the sintering process. Sintering decomposes organic additives, allowing the conductive particles to interact.

There are many sintering techniques, such as thermal, chemical, electric, and laser sintering, for example, thermal sintering to over 100 degrees Celsius or extended ultraviolet or infrared development. Advanced sintering techniques involve microwave, or laser radiation, xenon flash light, electrical or chemical sintering, and plasma. However, these processes result in extra costs and time after the printing process, and often involve high-cost equipment, require high energy, and/or require complex pre- or post-treatments.

Sintering the printed metal micro/nanoparticle ink at an elevated temperature (e.g., in a thermal oven) makes it electrically conductive, while thermal decomposition (known as pyrolysis) and vaporization might be used to remove the polymeric ligands. Simultaneously, the contacting metal micro/nanoparticles are fused together via interfacial atomic diffusion and neck formation.

However, sintering silver nanoparticle inks in a thermal oven, for instance, although conceptually straightforward, poses practical limitations for printed electronics on common low-cost polymer substrates (e.g., polycarbonate and polyethylene terephthalate) with glass transition temperature well below 200° C. To avoid thermal damage to the plastic substrate, the printed parts should not be sintered above the heat deflection temperature of substrate. On the other hand, it is often desired to obtain lowest possible resistivity of the sintered ink material for the desired electronic performance, thus it is important to remove the polymer ligands via the sintering process. When producing functional electronic devices, it is also important to have adequate adhesion and cohesion of the sintered nanoparticle material on a substrate, which may also require increased sintering temperature.

The method of thermal oven sintering is still widely used in printed electronics production. Some modern silver nanoparticle inks can now be sintered at temperatures as low as about 100° C. However, this comes with the undesired result of an impractical long duration (e.g., days) just to achieve marginal values of electrical conductivity.

SUMMARY

The following presents a simplified summary in order to provide a basic understanding of the disclosure. The summary is not an extensive overview of the disclosure. It is neither intended to identify key or critical elements nor to delineate the scope of the disclosure. The following summary merely presents some concepts in a simplified form as a prelude to the more detailed description below.

Described herein are examples of self-sintering conductive inks that can be printed and self-sintered with a simple and low-cost process mechanized by exothermic alkali metal and water reaction, with enhanced electrical and thermal performance by liquid metal fusion. Such self-sintering conductive inks may include a gallium-alkali metal component and a water absorbing gel component.

After patterning, the self-sintering inks, on reaching a designed trigger temperature (including room temperature), may metallize through a two-step process. A first step may comprise raising the temperature to the trigger temperature so as to cause the gallium-alkali metal component to activate and react with water released from the water absorbing gel component. The exothermic reaction between the water and the alkali element creates an intense and highly localized heating effect, which liquefies all metallic components in the ink and, on cooling, creates a solid metal trace or interconnect. Post cooling, the metal trace or interconnect cannot be reflowed without a significant temperature increase (well above 100's of degrees Celsius) or other energetic input.

DESCRIPTION

Pre-existing conductive inks that enable formation of conductive patterns require a step of thermal sintering to over 100° C., extended ultraviolet or infrared development, or other external energetic stimulus. Certain advanced sintering processes such as microwave, or laser radiation, xenon flash light, electrical or chemical sintering, and plasma involve high-cost equipment and require high energy or complex pre- or post-treatments.

Certain electronic applications require low-temperature substrates (e.g., paper, polyethylene terephthalate (PET), polyether ether ketone (PEEK), bioelectronics, organic membranes, polyethylene films) and/or processing including die-bonding and 2.5/3D electronic packaging. The step of thermal sintering to over 100° C., extended ultraviolet or infrared development, or other external energetic stimulus may adversely affect such substrates. Despite years of intensified research efforts, the method of thermal oven sintering is still widely used in printed electronics production.

Mitsubishi Paper Mill and The Hebrew University of Jerusalem developed so called "built-in" or halide-triggered silver inks sintered at or near room temperature. However, the halide used may cause environmental concerns with advent of "green" electronics and environmental-friendly industries. Further, due to corrosion issues, silver is not a good stand-alone conductor (especially in bioelectronic applications).

Aspects of the disclosure allow for low temperature self-sintering without the environmental concerns of "built-in" or halide-triggered silver inks. Self-sintering conductive inks are mechanized by exothermic alkali metal and water reaction and enhanced electrical and thermal performance are obtained with liquid metal fusion.

The self-sintering conductive inks can be processed and applied at low or near room temperatures, and used as solders or electrically conductive adhesives, thermal interface materials, and/or conductive traces/interconnects for both printed rigid and flexible electronics on the substrates of metals, ceramics, and polymers. Also or alternatively, they can be formulated and tuned to function as electrical and/or thermal conductors, semiconductors, dielectrics, or insulators. By modifying the ink to change its temperature set point, new desired circuits can be added to a system on reaching different temperatures. Pre-application surface treatments can also be used to improve adhesion or reduce wetting so the ink stays localized. The materials and processes disclosed herein are cost-effective for many applications.

Aspects of the present disclosure relate to formulation, process, and application of self-sintering conductive inks mechanized by exothermic reaction between metal and water or other media and performance enhanced by liquid metal fusion.

The self-sintering conductive inks may be formulated based on micro- and/or nano-sized conductive fillers, gallium-alkali metal low melting point alloys, and a water-absorbing gel prepared from water and/or hydrogen peroxide and a water-soluble resin.

The micro-/nano-sized conductive fillers may provide electrical and/or thermal conductivities. These conductive fillers may include, for example, nanoparticles, nanowires/whiskers, and/or micron size particles that are highly conductive. The conductive fillers may have electrical and thermal conductivities comparable or the same to the relevant highly conductive bulk metals that are typically used in forming interconnections and the like on, for example, printed circuit boards. Suitable conductive fillers include, but are not limited to, silver, gold, copper, zinc, aluminum, nickel, or carbon (carbon black, carbon nanotube and graphene); silver or gold coated copper, zinc, aluminum, nickel, or carbon; other metals and alloys; and a combination of different fillers.

In general, particle sizes may range from 20 nm to 2000 µm. The particle size is usually from 100 nm to 100 µm due to the combined considerations of material processing cost, performance, and easy operation. The minimum particle size may be as low as 4 nanometers or even lower, but at least 20 nm may be more common for commercial applications, mainly due to the consideration of material processing cost and operation difficulty.

The gallium-alkali metal alloy has a low melting point and provides non-oxidized metal for exothermic water reaction to trigger self-sintering and liquid metal fusion. The exothermic reaction provides the heat to allow the conductive fillers to melt and form liquid metal. The liquid metal can flow to fill voids and modify connectivity of the conductive network to enhance electrical and thermal conductivities. The resulting concentration and distribution of the liquid metal can be tuned to improve flexibility and stretchability of the printed patterns or structures. The gallium-alkali alloy may also improve adhesion performance or bonding strength between the substrate and the printed patterns or structures.

The melting point range of the gallium-alkali metal may be −15° C. to 300° C. Commercially, the melting point of low melting alloys is usually below 150° C. In aspects described herein, the melting point can be below 85° C., or around room temperatures (e.g. 23 to 35° C.), especially for some polymer substrates with low glass transition temperatures Gallium-alkali metals typically contain 1-50 wt. % alkali metal and additional elements. In one aspect the gallium-alkali metal contains 1-30 wt. % alkali metal and additional elements. Examples of suitable gallium-alkali metal alloys may include Ga—Al, Ga—AlTiC, Ga—Al—Ti—B, Ga—Mg, Ga—Zn, Ga—Fe, Ga—Li, Ga—K, Ga—Ba, Ga—Ca, and Ga—Na with or without a combination of other elements, such as In, Sn, Ti, B, C, Ag, Cu, Fe, Si, Pb, Zn, Ni, Cr, Bi, and rare earth elements etc. At least one aspect utilizes a gallium-aluminum (Ga—Al) alloy, with or without a combination of other elements. The gallium-alkali metal may be a liquid or solid when it reacts with water.

The water absorbing gel functions as a binder and suspending agent for the conductive fillers and gallium-alkali metal alloys during printing and also provides water for the exothermic reaction during self-sintering. The water absorbing gel may be formed with a water-soluble resin and water or hydrogen peroxide or mixtures thereof. Water-soluble resins may comprise nonionic polymers such as nonionic poly(ethylene oxide) polymer. Suitable commercial water-soluble resins include, for example, DowDuPont's POLYOX™ WSR N750 or POLYOX™ WSR 301.

The water absorbing gel may include other water-soluble additives such as phosphorus oxoacid compound, halogen compound, gelatin, polyvinyl alcohol, polyvinyl acetal, polyvinylpyrrolidone, carrageenan, carboxylmethylcellulose, or hydroxylpropyl cellulose. Also or alternatively, the water absorbing gel may include additives such as KOH, KCl, NaCl, HCl, $Ba_2Cl_2$, BiOCl, $NaBH_4$, $NaMgH_3$, $Al(OH)_3$ to enhance the exothermic reaction (changing the reaction strength and temperature) and promote the self-sintering at relatively low temperatures. In addition, polymeric binders, such as acrylic, silicone, styrene, fluoroelastomers, or urethane backbones, may be added in suitable amounts to aid homogeneous dispersion of the fillers and the gallium-alkali alloys (both liquid and solid), to hold the ink components together upon solvent evaporation, and/or to help bind the printed trace onto the substrate.

Other additives may be used in suitable amounts to adjust to the desired rheological, wetting, healing, stretching, and/or other properties of the inks for different printing technologies, such as screen printing, syringe-needle type dispenser, inkjet, 3-D printing, etc. Additives in the form of surfactants, adhesion improvers, humectants, penetration promoters, and stabilizers may be used to tailor the ink properties for specific applications.

Ink solvents other than, or in addition to, water may be used to provide enhanced solubility to the water-soluble polymer or other polymeric binder and impart favorable viscosity, surface tension, and homogeneity.

The ratio (weight percentage) of the water-soluble resin in water or hydrogen peroxide solution is typically from 1-20 wt. % for different printing processes and applications. The higher the percentage of the resin, e.g., 10 wt. % to 20 wt. %, or 15 wt. % to 20 wt. %, the higher the viscosity of the formed gel. The lower the percentage of the resin, e.g., 1 wt. % to 10 wt. %, or 1 wt. % to 5 wt. %, the lower the viscosity of the formed gel. The ratio between the water or hydrogen peroxide and water-soluble resin in the solution gel, and the gel's concentration in the ink, can be tuned or manipulated to make the exothermic reaction provide high enough temperature for the self-sintering, meanwhile the formation of oxides, metal oxyhydrides, and $H_2$ bubbles can be manipulated to minimize the volume of formed voids and remaining reactants after the self-sintering.

The gel's concentration in the ink (weight percentage) may be 20 to 40 wt. %. The ink formulations may be tuned by adjusting the ratio of the water-soluble resin over Ga-alkali metal. For example, (1) when the gel percentage gets closer to 40 wt. %, e.g., 30 wt. % to 40 wt. %, the Al or Mg in the Ga liquid metal tends to be consumed completely as the self-sintering is completed within the designed time; (2) when the gel percentage gets closer to 20 wt. %, e.g., 20 wt. % to 30 wt. %, the alkali metal tends to remain available for the exothermic reaction to continue even after self-sintering, which may be used, for example, for sensing and anti-temper or other applications.

In at least one aspect, water absorbing poly(ethylene oxide) gel is generally a mixture of water ($H_2O$) and/or hydrogen peroxide ($H_2O_2$) and 1-15 wt. % water-soluble poly(ethylene oxide) polymer. In one particular, non-limiting example, the water-soluble poly(ethylene oxide) polymer may have, for example, a general composition of 95% to 100% poly(ethylene oxide), up to 3% fumed silica, and up to 1% calcium as mixed salts.

The above constituents can be stably mixed, stored, and printed below the gallium-alkali metal eutectic reaction temperature (e.g. about 26.8° C. for Ga—Al eutectic reaction) to avoid the exothermic reaction. The self-sintering conductive inks can be processed and applied at low or near room temperatures, or at higher temperatures. The self-sintering conductive inks can be self-sintered when the environmental temperature is above the gallium-alkali metal eutectic reaction temperature to trigger the exothermic reaction and liquid metal fusion.

A relatively higher temperature (about 100° C. for example) also can be used for self-sintering to reduce the sintering time from about 2 hours (self-sintering at about 30° C. for Ga—Al eutectic reaction) to several minutes or less. This higher temperature self-sintering is useful for shortening the time on substrates that can withstand the higher temperature. Limited optical, thermal or sonic excitation could also be used to accelerate the self-sintering process.

The substrates include, for example, metals or alloys, (e.g., copper, aluminum, stainless steel), polymers (e.g., polyethylene terephthalate (PET), polyethylene naphthalate (PEN), polycarbonate (PC), polyethersulfone (PES), polyimide (PI) and polyarylate (PAR), and polydimethylsiloxane (PDMS) as stretchable substrate), glasses, ceramics, papers, and/or textiles.

The self-sintering conductive inks enable metal traces and interconnects to be formed in electronic circuits without any external heating or other forms of energetic input (microwave, laser, sonic, electroplating etc.) Thus this disclosure enables technologies that cannot endure extreme temperatures during manufacture, but still require traces and interconnects with conductivity on par with bulk metal. The self-sintering conductive inks can be formulated for different applications with multiple functions. Representative applications include, without limitation, flexible/wearable electronics, bioelectronics (including implants), batteries, die-bonding, 2.5/3D electronic systems-on-a-chip, and multistep electronics packaging where multiple solder reflows would destroy precursor assembly steps and hybrid chemical/electronic systems.

Figure 1:
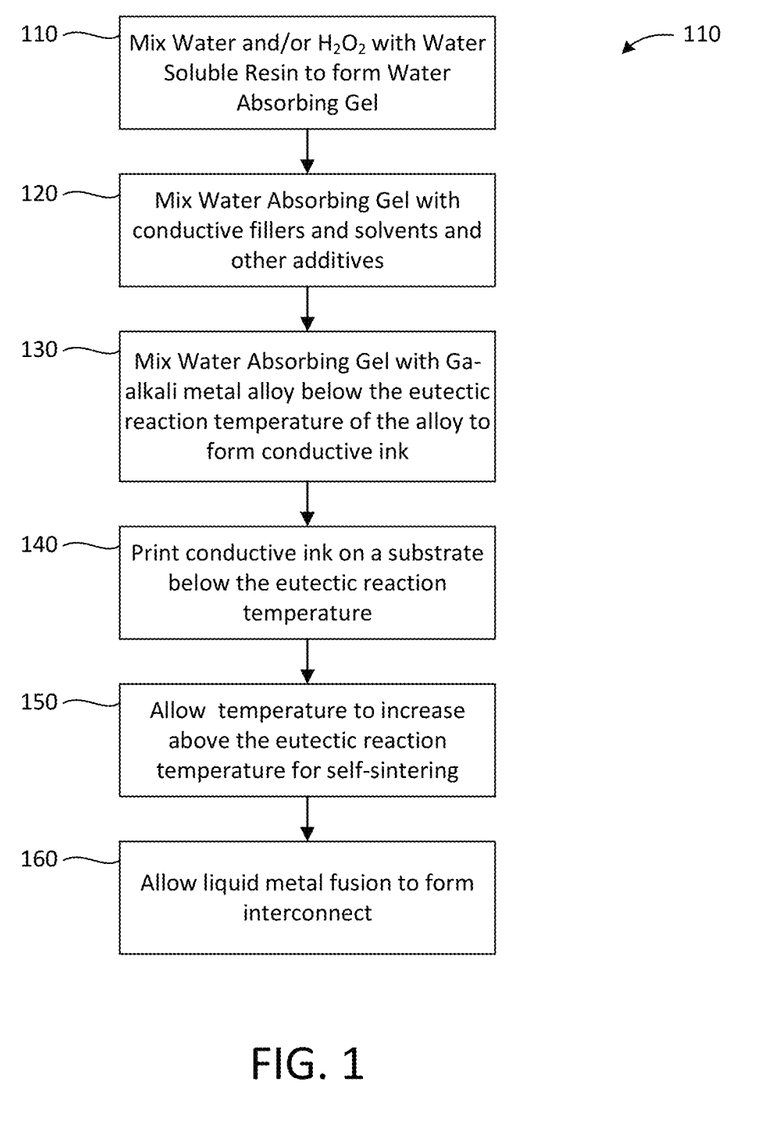
FIG. 1 shows a flow chart of a method of preparing an interconnect in accordance with aspects of the disclosure.

FIG. 1 is a flow chart (100) illustrating an example of a process for making and using self-sintering conductive inks in accordance with at least one aspect of the present disclosure.

In a first step (110), water or hydrogen peroxide is mixed with a water-soluble resin to form a water absorbing gel. In a second step (120), the water absorbing gel is mixed with conductive fillers and suitable solvents and/or additives. In a third step (130), the water absorbing gel is mixed with gallium-alkali metal alloy low melting alloy below the eutectic reaction temperature. Step (110) may be combined with steps (120) and/or (130). For example, water or hydrogen peroxide may be mixed with a water-soluble resin and the conductive fillers and/or gallium-alkali metal alloy. During all of these steps the mixtures are kept below the eutectic reaction temperature of the gallium-alkali metal alloy.

In a fourth step (140), the resulting conductive ink is printed and/or otherwise applied onto the desired substrate at a temperature below the eutectic reaction temperature of the gallium-alkali metal alloy. Optionally, prior to printing and/or other application, the substrate may be pretreated by, for example, plasma clean or atomic layer deposition of thin film to inhibit wetting or promote adhesion.

In a fifth step (150), the temperature is raised above the eutectic reaction temperature whereby the alkali metal reacts with water in an exothermic reaction causing an increase in temperature whereby the printed material self-sinters. The increase in temperature caused by the exothermic reaction is sufficient for the conductive fillers to melt. In a sixth step (160), liquid metal resulting from the exothermic reaction fills voids and then fuses into the desired interconnect, for example. Optionally, sonic, thermal, or optical excitation may be used to accelerate the self-sintering process or reduce voids.

The self-sintering inks can be used as solders or electrically conductive adhesives, thermal interface materials, and/or conductive traces/interconnects for both printed rigid and flexible electronics on the substrates of metals, ceramics, and polymers. They also can be formulated and tuned to function as electrical and thermal conductors, semiconductors, dielectrics, or insulators.

Figure 2:
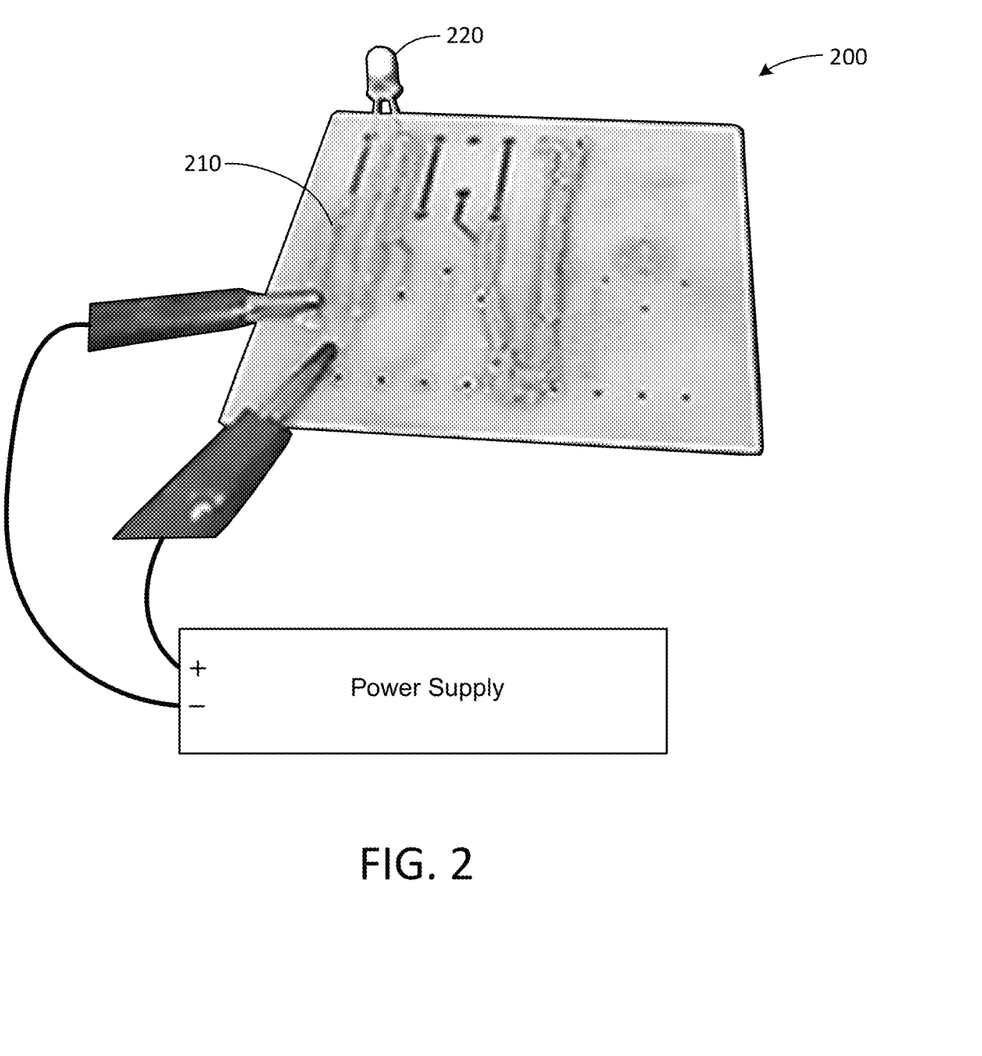
FIG. 2 shows an example printed self-sintered ink on a printed circuit board and used as an electrical interconnect to illuminate an LED bulb in accordance with aspects of the disclosure.
Figure 3:
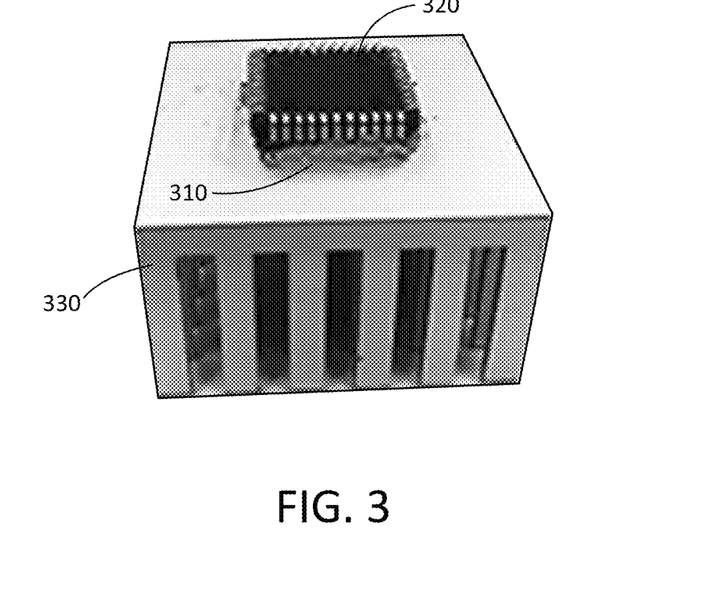
FIG. 3 shows an example printed self-sintered ink as a thermal interface material (TIM) to thermally connect an electrical component/die to a heat sink in accordance with aspects of the disclosure.

FIG. 2 shows an example of printed self-sintered ink (210), such as one or more of those described herein, on a printed circuit board (200) which is used as an electrical interconnect to illuminate an LED bulb (220). FIG. 3 shows an example of self-sintered ink (310), such as one or more of those described herein, as a thermal interface material (TIM) to thermally connect an electrical component/die (320) to a heat sink (330).

Compared with other printable inks and thermal interface materials:

The sintering temperatures (for example, about room temperature 23-35° C.) of one or more of the self-sintered inks described herein may be tuned to values comparable with liquid metal inks (such as EGaIn and $Bi_{35}In_{48.6}Sn_{16}Zn_{0.4}$), and/or may be much lower than other printable inks such as nano-silver inks (typically ≥150° C.), and solder based interface materials (320-340° C. for eutectic AuSn solder as an example).

The electrical thermal conductivity of the self-sintered ink is able to be tuned better than, or comparable to, liquid metal ink (EGaIn—$3.4\times10^6$ S/m, $Bi_{35}In_{48.6}Sn_{16}Zn_{0.4}$—$7.3\times10^6$ S/m) and nano-silver ink (Ag-DDA—$3.45\times10^7$ S/m, Ag-PVP—$6.25\times10^6$ S/m), and much better than carbon conductive ink (CNT (carbon nanotube)—$5.0\times10^3$ S/m).

The thermal conductivity of one or more of the self-sintered inks described herein may be comparable with solder based thermal interface materials such as indium (56 W/mK) and eutectic Au—Sn (57 W/mK).

The bonding strength, with a metal substrate, of one or more of the self-sintered inks described herein may be comparable with commercial solders such as to SnPb or SnBi solders (about 40-70 MPa), and lower than eutectic Au—Sn (about 270 MPa).

Mechanical flexibility of one or more of the self-sintered inks described herein may be much better than solders such as Au—Sn to match with different substrates, which may facilitate improved handling of thermal stress, and which can be tuned to be soft enough for some applications where the heated materials expand at remarkably different rates.

The thermal interface material (TIM) used to attach a die to a heat spread/component substrate (more common) or directly to a heat sink is usually named TIM1. The TIM used between a heat spreader and a heat sink is named TIM2. A solder like Au—Sn is generally used as TIM1. A TIM consisting of or comprising one or more of the self-sintering inks described herein may be used for both TIM1 and TIM2.

Example 1

An ink formulation was prepared with a water-soluble gel (10 wt. % DowDuPont POLYOX™ WSR N750, water solution), 43 wt. % liquid metal (Ga+2 wt. % Al5Ti0.15C), and 30 wt. % Ag powder having and average size of 5 μm.
(a) N750 powder was mixed with water to form a uniform gel (used vacuum furnace and ultrasonic to remove the gas bubbles in the gel) at room temperature (about 30° C.).
(b) The gel was mixed with Ag powder at room temperature, and then mixed with the Ga—AlTiC liquid metal under 0 to 20° C.
(c) A syringe dispenser was used to print the mixed ink on Cu and Al foil and made Cu—Cu joints under 0 to 20° C. for electrical resistance and adhesion strength testing.
(d) The printed samples were brought back to room temperature (about 30° C.) for self-sintering for about 2 hours until the inks completely dried.

Figure 4:
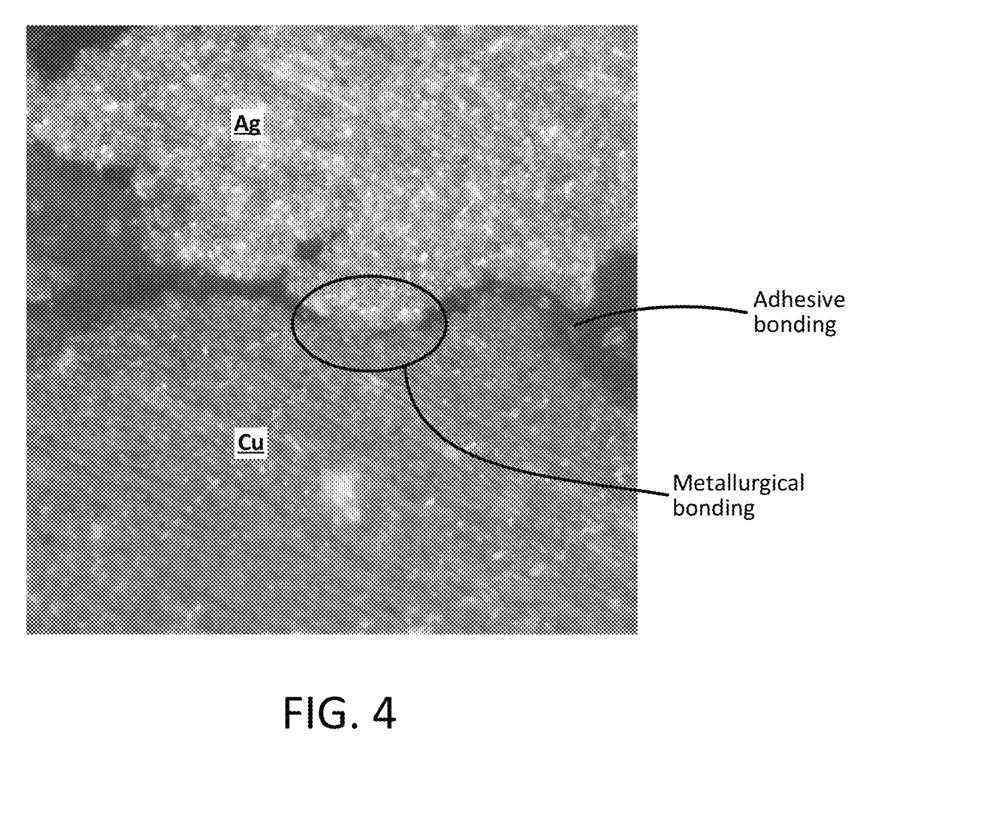
FIG. 4 shows example bonding between self-sintered ink and a copper substrate in accordance with aspects of the disclosure.

The pull strength was 19 lbs. for a Cu—Cu joint with a jointing area of 1 cm$^2$ (about 20 lbs for the same Sn60Zn40 soldering joint). FIG. 4 shows cross-section imaging analysis of the Cu—Cu ink joint, specifically, the formation of a metallurgical bonding between self-sintered ink and Cu substrate after the room temperature self-sintering. The printed conductive line with a length of about 2 cm (cross section area about 5 mm$^2$) was measured using a Ohm meter, the electrical resistivity was nonconductive before self-sintering, about 0.005 Ohms after self-sintering. The estimated thermal conductivity was over 60 W/mK.

Example 2

The following is a general formulation for different applications.

| Amount | Ingredient |
|---|---|
| 20-40 wt. % | Water-soluble Resin (3-20) wt. % POLYOX™ WSR N750 or other resin water solution |
| 1-45 wt. % | Ga-alkali metal |
| 0-60 wt. % | Ag powder |
| 0-6 wt. % | Cu powder |
| 0-20 wt. % | Silicone |
| 0-30 wt. % | $Fe_3O_4$ or MnZn or FeSi magnetic powder |

Comparative Example

A pre-existing silver nanoparticle ink was heated to 70° C., the particles appeared to touch each other as the organic molecules started moving away from particle surface; but the electrical resistivity reached minimum value only at a temperature >200° C. and then increased with further heating to temperature beyond 250° C. due to growing pore size with reduced connectivity among coalesced large metal domains. To achieve a high conductivity, further sintering is required to transform the initially very small contact areas into thicker necks and, eventually, to a dense layer.

In the initial stage of sintering, the driving forces are mainly surface energy reduction due to the silver particle's large surface-to-volume ratio, a process known as Ostwald ripening. Ostwald ripening triggers surface and grain boundary diffusion within the coalesced Ag nanoparticles. Grain boundary diffusion allows for neck formation and neck radii increase, which is diminished by the energy required for grain boundary creation. As the sintering develops into a deep level, the relative density of the printed Ag particle based conductive trace or film increase and the electric conductivity increases.

At present, silver nanoparticle-based inks are the most commonly used inks because silver possesses the highest electrical conductivity that is not retarded by its oxidation. Copper nanoparticle-based ink is another promising material for printed electronics, which can potentially replace silver nanoparticle ink. Copper's conductivity is only 6 percent lower than that of silver, while its cost is less than a few percent of the price of silver. However, spontaneous formation of copper oxides (both $Cu_2O$ and CuO) on the surface of the particles at ambient conditions can cause substantial decrease in electrical conductivity and an increase in the sintering temperature.

Methods used to overcome the oxidation issue include performing the synthesis in organic solvents (such as polyols, octyl ether, octylamine, toluene, heptanes) often under inert atmosphere (Ar, $N_2$), as well as minimizing the exposure of copper nanoparticles to oxygen by forming a protective layer that surrounds the particles. For example, performing synthesis in water in the presence of CTAB (cetyl trimethylammonium bromide) and CTAB-PVP (PVP stands for polyvinylpyrrolidone) mixture.

Stable copper nanoparticles may also be obtained by the formation of a copper formate shell, induced by a reaction of an interfacial copper oxide with formic acid. Such shell can be transformed into copper at a low temperature, resulting in highly conductive metallic films. Due to the susceptibility of Cu to oxidation, the usual post-deposition treatment methods include expensive and instrumentally elaborate flash lamp and laser sintering approaches in the pre-existing copper nanoparticle-based ink.

An easy to scale process is reported by using formic acid to sinter structures that are inkjet-printed using an industrial scale Cu nanoparticle ink at temperatures at or above 130° C. Up to 16% bulk Cu electrical conductivity is obtained when sintering is carried out at 130° C. and more than 25% bulk Cu conductivity is observed above 150° C. It is suggested that when the sintering temperature exceeds the melting point of nano-copper (>350° C.), a stable conductivity channel is formed on the substrate surface.

In contrast, the self-sintering conductive inks such as those described herein can be processed and applied at low or near room temperatures and do not require expensive or complicated equipment or extra process steps to avoid oxidation. Ga-alkali alloys having low melting points can supercool far below their melting point making it possible to process and apply the ink at much lower temperatures. The self-sintering conductive inks can be used as solders or electrically conductive adhesives, thermal interface materials, and/or conductive traces/interconnects for both printed rigid and flexible/stretchable electronics and soft robots. They also can be formulated and tuned to function as electrical and thermal conductors, semiconductors, dielectrics or insulators, and/or transition from insulator to conductor by thermal or mechanical stimulations. The used materials and processes are cost-effective for many appropriate applications.

Depending on difference in conductivity between the preset and set inks, for example, the printing process described herein may be useful for anti-tamper and emergency temperature response such as bringing an auxiliary cooling unit online. By modifying the ink to change its temperature set point, new desired circuits can be added anytime to a system on reaching different temperatures.

The foregoing has been presented for purposes of example. The foregoing is not intended to be exhaustive or to limit features to the precise form disclosed. The examples discussed herein were chosen and described in order to explain principles and the nature of various examples and their practical application to enable one skilled in the art to use these and other implementations with various modifications as are suited to the particular use contemplated. The scope of this disclosure encompasses, but is not limited to, any and all combinations, subcombinations, and permutations of structure, operations, and/or other features described herein and in the accompanying drawing figures.

We claim:
1. A self-sintering conductive ink comprising
   i. micro- and/or nano-sized conductive silver fillers;
   ii. a Ga—Al alloy wherein the Ga—Al alloy only further comprises at least one selected from the group consisting of Sn, Ti, B, C, Ag, Cu, Fe, Si, Pb, Zn, Ni, Cr, Bi, and rare earth elements; and
   iii. a water absorbing gel comprising a water-soluble poly(ethylene oxide) resin and water, hydrogen peroxide, or mixtures thereof;
   wherein the self-sintering conductive ink self-sinters when a temperature is raised above the eutectic melting point of the Ga—Al alloy.
2. The self-sintering conductive ink of claim 1 comprising 20-40 wt. % water-soluble resin and water/hydrogen peroxide, 1-45 wt. % Ga—Al alloy, 0-60 wt. % Ag powder, 0-6 wt. % Cu powder, 0-20 wt. % silicone, and 0-30 wt. % Fe3O4 or MnZn or FeSi magnetic powder.
3. A method of forming a self-sintering conductive ink comprising: mixing a water-soluble poly(ethylene oxide) resin with water, hydrogen peroxide, or mixtures thereof to form a water absorbing gel; and mixing the water absorbing gel with conductive silver fillers and a Ga—Al alloy at a temperature below the eutectic reaction temperature of the Ga—Al alloy; wherein the Ga—Al alloy only further comprises at least one selected from the group consisting of Sn, Ti, B, C, Ag, Cu, Fe, Si, Pb, Zn, Ni, Cr, Bi, and rare earth elements.
4. A method of applying a conductive ink to a substrate comprising
   i. printing a self-sintering conductive ink on a substrate, the self-sintering conductive ink comprising a water absorbing gel formed from a water-soluble poly(ethylene oxide) resin and water, hydrogen peroxide, and mixtures thereof; micro- and/or nano-sized conductive silver fillers; and a Ga—Al alloy, wherein the printing occurs at a temperature below the eutectic reaction temperature of the Ga—Al alloy; wherein the Ga—Al alloy only further comprises at least one selected from the group consisting of Sn, Ti, B, C, Ag, Cu, Fe, Si, Pb, Zn, Ni, Cr, Bi, and rare earth elements;
   ii. raising the temperature to above the eutectic reaction temperature of the Ga—Al alloy; and
   iii. allowing the Ga—Al alloy and water to react exothermically to trigger melting of the conductive fillers.
5. The method of claim 4 further comprising pretreating the substrate, by plasma clean or by atomic layer deposition of thin film, to inhibit wetting and/or promote adhesion.
6. The method of claim 4 further comprising accelerating the exothermic reaction by application of optical, thermal, or sonic stimulation.

* * * * *

UNITED STATES PATENT AND TRADEMARK OFFICE
CERTIFICATE OF CORRECTION

PATENT NO. : 12,152,156 B2  
APPLICATION NO. : 17/211248  
DATED : November 26, 2024  
INVENTOR(S) : Timler et al.

Page 1 of 1

It is certified that error appears in the above-identified patent and that said Letters Patent is hereby corrected as shown below:

In the Claims

Claim 1, Column 10, Line 1:  
Delete "comprising" and insert --comprising:--

Claim 4, Column 10, Line 29:  
Delete "comprising" and insert --comprising:--

Signed and Sealed this  
Twenty-sixth Day of August, 2025

Coke Morgan Stewart  
*Acting Director of the United States Patent and Trademark Office*